United States Patent
Ko et al.

(10) Patent No.: US 8,946,350 B2
(45) Date of Patent: Feb. 3, 2015

(54) CURABLE COMPOSITION

(71) Applicant: LG Chem, Ltd., Seoul (KR)

(72) Inventors: Min Jin Ko, Daejeon (KR); Jae Ho Jung, Daejeon (KR); Bum Gyu Choi, Daejeon (KR); Min A Yu, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 13/953,493

(22) Filed: Jul. 29, 2013

(65) Prior Publication Data

US 2014/0039113 A1    Feb. 6, 2014

(30) Foreign Application Priority Data

Jul. 27, 2012 (KR) .................. 10-2012-0082684
Jul. 29, 2013 (KR) .................. 10-2013-0089713

(51) Int. Cl.
| | |
|---|---|
| *H01L 23/29* | (2006.01) |
| *C08K 7/02* | (2006.01) |
| *C08K 7/10* | (2006.01) |
| *H01L 33/56* | (2010.01) |
| *C08L 83/14* | (2006.01) |
| *C08G 77/12* | (2006.01) |
| *C08G 77/20* | (2006.01) |
| *C08G 77/00* | (2006.01) |

(52) U.S. Cl.
CPC ................. *H01L 33/56* (2013.01); *C08L 83/14* (2013.01); *C08G 77/12* (2013.01); *C08G 77/20* (2013.01); *C08G 77/80* (2013.01)

USPC ........... 524/588; 524/444; 524/445; 525/477; 525/478; 528/31; 528/32; 528/43; 257/789; 257/791

(58) Field of Classification Search
None
See application file for complete search history.

(56) References Cited

U.S. PATENT DOCUMENTS

| | | | | |
|---|---|---|---|---|
| 4,721,764 | A * | 1/1988 | Fujiki et al. ................ | 528/15 |
| 8,372,764 | B2 * | 2/2013 | Yano et al. ................. | 442/59 |
| 2009/0298976 | A1 * | 12/2009 | Yano et al. ................. | 524/35 |
| 2012/0056236 | A1 * | 3/2012 | Hamamoto et al. ......... | 257/100 |

FOREIGN PATENT DOCUMENTS

| | | |
|---|---|---|
| CN | 102083890 A | 6/2011 |
| KR | 1020120080141 A | 7/2012 |
| WO | 2011/090364 A2 | 7/2011 |

* cited by examiner

*Primary Examiner* — Marc Zimmer
(74) *Attorney, Agent, or Firm* — McKenna Long & Aldridge, LLP

(57) ABSTRACT

Provided are a curable composition and its use. The curable composition can exhibit excellent processibility and workability. The curable composition exhibits excellent light extraction efficiency, hardness, thermal and shock resistance, moisture resistance, gas permeability and adhesiveness, after curing. In addition, the curable composition can provide a cured product that exhibits long-lasting durability and reliability even under harsh conditions, and that does not cause whitening and surface stickiness.

19 Claims, No Drawings

CURABLE COMPOSITION

FIELD

The present application relates to a curable composition and its use.

BACKGROUND

A light-emitting diode (LED), particularly a blue or ultraviolet (UV) LED having an emission wavelength of approximately 250 nm to 550 nm, is a high-brightness product using a GaN-based compound semiconductor such as GaN, GaAlN, InGaN or InAlGaN. In addition, it is possible to form a high-quality full-color image by a method of combining red and green LEDs with a blue LED. For example, a technique of manufacturing a white LED by combining a blue or UV LED with a fluorescent material is known.

Such LEDs are widely used as backlights for liquid crystal displays (LCDs) or as lighting.

As an LED encapsulant, an epoxy resin having high adhesive strength and excellent mechanical durability is widely used. However, the epoxy resin has lower light transmittance in a blue light or UV ray region, and low heat and light resistance. For example, Japanese Patent Application Nos. H11-274571, 2001-196151 and 2002-226551 present techniques for solving the above-described problems. However, encapsulants disclosed in the above references do not have sufficient heat resistance and light resistance.

TECHNICAL OBJECT

The present application provides a curable composition and its use.

Solution

One aspect of the present application provides a curable composition including components that can be cured by hydrosilylation, for example, a reaction between an aliphatic unsaturated bond and a hydrogen atom. For example, the curable composition may include a polymerized product including a polyorganosiloxane having a functional group including an aliphatic unsaturated bond (hereinafter, referred to as "polyorganosiloxane (A)").

The term "M unit" used herein may refer to a monofunctional siloxane unit possibly represented as $(R_3SiO_{1/2})$ in the art, the term "D unit" used herein may refer to a bifunctional siloxane unit possibly represented as $(R_2SiO_{2/2})$ in the art, the term "T unit" used herein may refer to a trifunctional siloxane unit possibly represented as $(RSiO_{3/2})$ in the art, and the term "Q unit" used herein may refer to a tetrafunctional siloxane unit possibly represented as $(SiO_{4/2})$. Here, R is a functional group binding to a siloxane atom, and may be, for example, a hydrogen atom, a hydroxyl group, an epoxy group, an alkoxy group, or a monovalent hydrocarbon group.

The polyorganosiloxane (A) may have, for example, a linear structure or a partially-crosslinked structure. The term "linear structure" may refer to a structure of a polyorganosiloxane composed of the M and D units. In addition, the term "partially-crosslinked structure" may refer to a sufficiently long linear structure of a polyorganosiloxane, which is derived from the D unit, and to which the T or Q unit, for example, the T unit, is partially introduced. In one embodiment, the polyorganosiloxane having a partially-crosslinked structure may refer to a polyorganosiloxane having a ratio (D/(D+T+Q)) of the D unit with respect to all D, T and Q units included in the polyorganosiloxane of 0.65 or more.

In one embodiment, the polyorganosiloxane (A) having a partially-crosslinked structure may include D and T units sharing one oxygen atom and linked to each other. The linked units may be represented by, for example, Formula 1.

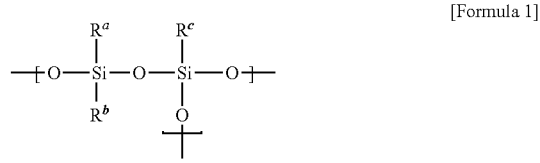

[Formula 1]

In Formula 1, $R^a$ and $R^b$ are each independently an alkyl group, an alkenyl group, or an aryl group, and $R^c$ is an alkyl group or an aryl group.

In Formula 1, $R^c$ and $R^b$ may be, for example, both simultaneously an alkyl group or an aryl group.

The polyorganosiloxane (A) having a partially-crosslinked structure may include at least one unit of Formula 1. The unit of Formula 1 is a unit of such a type that a silicon atom of the D unit and a silicon atom of the T unit are directly bound by means of an oxygen atom among the siloxane units forming the polyorganosiloxane (A). For example, as will be described later, the polyorganosiloxane including the unit of Formula 1 may be prepared by polymerizing, for example, ring-opening polymerizing, a mixture including a cyclic siloxane compound. When the method is applied, a polyorganosiloxane including the unit of Formula 1 and having minimum amounts of silicon atoms binding to an alkoxy group and silicon atoms binding to a hydroxyl group in its structure may be prepared.

The polyorganosiloxane (A) may include at least one functional group including an aliphatic unsaturated bond, for example, at least one alkenyl group. For example, a molar ratio (Ak/Si) of functional groups including the aliphatic unsaturated bond (Ak) and total silicon atoms (Si) included in the polyorganosiloxane (A) may be approximately 0.01 to 0.3, or 0.02 to 0.25. As the molar ratio (Ak/Si) is controlled to 0.01 or more, or 0.02 or more, reactivity can be suitably maintained, and leakage of an unreacted component from a cured product can be prevented. In addition, as the molar ratio (Ak/Si) is controlled to 0.3 less, or 0.25 or less, crack resistance of the cured product can be excellently maintained.

The polyorganosiloxane (A) may include an aryl group, for example, at least one aryl group binding to a silicon atom. For example, a ratio of a mole (Ar) of the aryl group to a mole (R) of total functional groups binding to silicon in the polyorganosiloxane (A) may be a percentage (100×Ar/R) of approximately 30 to 60%. Within such a range, the composition may have excellent processibility and workability before curing, and may excellently maintain moisture resistance, light transmittance, refractive index, light extraction efficiency and hardness after curing. Particularly, as the ratio (100×Ar/R) is maintained at 30% or more, mechanical strength and gas permeability of the cured product may be suitably ensured, and crack resistance and light transmittance of the cured product can be excellently maintained at 60% or less.

The polyorganosiloxane (A) may include a unit of Formula 2 and a unit of Formula 3 as D units.

$(R^1R^2SiO_{2/2})$ [Formula 2]

$(R^3{}_2SiO_{2/2})$ [Formula 3]

In Formulas 2 and 3, $R^1$ and $R^2$ are each independently an epoxy group or a monovalent hydrocarbon group, and $R^3$ is an aryl group. In one embodiment, the $R^1$ and $R^2$ are each independently an alkyl group.

The term "monovalent hydrocarbon group" used herein, unless particularly defined otherwise, may refer to a monovalent residue derived from an organic compound composed of carbon and hydrogen, or a derivative thereof. For example, the monovalent hydrocarbon group may include 1 to 25 carbon atoms. The monovalent hydrocarbon group may be an alkyl group, an alkenyl group, an alkynyl group, or an aryl group.

The term "alkyl group" used herein may refer to, unless particularly defined otherwise, an alkyl group having 1 carbon atoms to 20 carbon atoms, 1 carbon atoms to 16 carbon atoms, 1 carbon atoms to 12 carbon atoms, 1 carbon atoms to 8 carbon atoms, or 1 carbon atoms to 4 carbon atoms. The alkyl group may have a linear, branched or cyclic structure, and may be optionally substituted with at least one substituent.

The term "alkenyl group" used herein may refer to, unless particularly defined otherwise, an alkenyl group having 2 carbon atoms to 20 carbon atoms, 2 carbon atoms to 16 carbon atoms, 2 carbon atoms to 12 carbon atoms, 2 carbon atoms to 8 carbon atoms, or 2 carbon atoms to 4 carbon atoms. The alkenyl group may have a linear, branched or cyclic structure, and may be optionally substituted with at least one substituent.

The term "alkynyl group" used herein may refer to, unless particularly defined otherwise, an alkynyl group having 2 carbon atoms to 20 carbon atoms, 2 carbon atoms to 16 carbon atoms, 2 carbon atoms to 12 carbon atoms, 2 carbon atoms to 8 carbon atoms, or 2 carbon atoms to 4 carbon atoms. The alkynyl group may have a linear, branched or cyclic structure, and may be optionally substituted with at least one substituent.

The term "aryl group" used herein may refer to, unless particularly defined otherwise, a monovalent residue derived from a compound including a benzene ring or a structure in which at least two benzene rings are condensed or connected by a covalent bond with one or two carbon atoms, or a derivative thereof. In the range of the aryl group, a functional group conventionally referred to as an aralkyl group or arylalkyl group may be included, in addition to a functional group conventionally referred to as an aryl group. The aryl group may be, for example, an aryl group having 6 carbon atoms to 25 carbon atoms, 6 carbon atoms to 21 carbon atoms, 6 carbon atoms to 18 carbon atoms, or 6 carbon atoms to 12 carbon atoms. The aryl group may be a phenyl group, a dichlorophenyl group, a chlorophenyl group, a phenylethyl group, a phenylpropyl group, a benzyl group, a tolyl group, a xylyl group, or a naphthyl group.

The term "epoxy group" used herein may refer to, unless particularly defined otherwise, a monovalent residue derived from a cyclic ether having three ring-forming atoms or a compound including the cyclic ether. The epoxy group may be a glycidyl group, an epoxyalkyl group, a glycidoxyalkyl group or an alicyclic epoxy group. An alicyclic epoxy group may include a monovalent residue derived from a compound including an aliphatic hydrocarbon ring structure, and a structure of an epoxy group formed by two carbon atoms of the aliphatic hydrocarbon ring. The alicyclic epoxy group may be an alicyclic epoxy group having 6 to 12 carbon atoms, for example, a 3,4-epoxycyclohexylethyl group.

As a substituent that may be optionally substituted to an epoxy group, or a monovalent hydrocarbon group, a halogen such as chlorine or fluorine, a glycidyl group, an epoxyalkyl group, a glycidoxyalkyl group, an epoxy group such as an alicyclic epoxy group, an acryloyl group, a methacryloyl group, an isocyanate group, a thiol group, or a monovalent hydrocarbon group may be used, but the present application is not limited thereto.

In the polyorganosiloxane (A), a ratio (Dm/Dp) of a mole number (Dm) of the siloxane unit of Formula 2 to a mole number (Dp) of the siloxane unit of Formula 3 may be, for example, approximately 0.3 to 2.0, 0.3 to 1.5, or 0.5 to 1.5. Within such a range of the ratio, a curable composition can have excellent light transmittance and mechanical strength, and no surface stickiness, and can ensure long-lasting durability by controlling moisture and gas permeability.

A percentage (100×Dp/D) of a mole number (Dp) of the siloxane unit of Formula 3 with respect to mole numbers (D) of all D units in the polyorganosiloxane (A) may be approximately 30% or more, 30% to 65%, or 30% to 60%. Within such a range, the curable composition can have excellent light transmittance and mechanical strength, and no surface stickiness, and can ensure long-lasting durability by controlling moisture and gas permeability.

A percentage (100×Dp/ArD) of the mole number (Dp) of the siloxane unit of Formula 3 with respect to the mole number (ArD) of D units including an aryl group of all D units in the polyorganosiloxane (A) may be approximately 70% or 80% or more. The upper limit of the percentage (100×Dp/ArD) is not particularly limited, and may be, for example, 100%. Within such a range, a curable composition having excellent processibility and workability before curing, and having excellent mechanical strength, gas permeability, moisture resistance, light transmittance, refractive index, light extraction efficiency, and hardness after curing can be provided.

In one embodiment, the polyorganosiloxane (A) may have an average compositional formula of Formula 4.

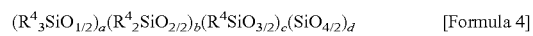
$(R^4_3SiO_{1/2})_a(R^4_2SiO_{2/2})_b(R^4SiO_{3/2})_c(SiO_{4/2})_d$ [Formula 4]

In Formula 4, $R^4$ are each independently an epoxy group or a monovalent hydrocarbon group, at least one of $R^4$ is an alkenyl group, and at least one of $R^4$ is an aryl group. The alkenyl group and the aryl group may be included, for example, to satisfy the above-described molar ratio.

The expression "polyorganosiloxane is represented as a certain average compositional formula" used herein means that the polyorganosiloxane is a single component represented as a certain average compositional formula, or a mixture of at least two components, and an average of compositions of components in the mixture is represented as the average compositional formula.

In the average compositional formula of Formula 4, a, b, c and d are each a molar ratio of siloxane units of the polyorganosiloxane (A). For example, a and b may each be a positive number, and c and d may each be 0 or a positive number. For example, when a sum of the molar ratios (a+b+c+d) is adjusted to be 1, a may be 0.01 to 0.3, b may be 0.65 to 0.97, c may be 0 to 0.30, or 0.01 to 0.30, and d may be 0 to 0.2. Here, b/(b+c+d) may be 0.7 to 1. When the polyorganosiloxane (A) has a partially-crosslinked structure, b/(b+c+d) may be 0.65 to 0.97, or 0.7 to 0.97. As a ratio of the siloxane units is controlled as described above, suitable physical properties according to an application can be ensured.

In another embodiment, the polyorganosiloxane (A) may have an average compositional formula of Formula 5.

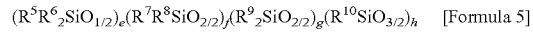
$(R^5R^6_2SiO_{1/2})_e(R^7R^8SiO_{2/2})_f(R^9_2SiO_{2/2})_g(R^{10}SiO_{3/2})_h$ [Formula 5]

In the average compositional formula of Formula 5, $R^5$ to $R^{10}$ are each independently an epoxy group or a monovalent hydrocarbon group. Here, at least one of $R^5$ and $R^7$ to $R^9$ may be an alkenyl group, at least one of $R^7$ to $R^9$ may be an aryl group. $R^7$ and $R^8$ are each independently an alkyl group, and $R^9$ is an aryl group.

In one embodiment, $R^5$ of Formula 5 may be a monovalent hydrocarbon group, for example, an alkenyl group, $R^6$ may be an alkyl group having 1 to 4 carbon atoms, $R^7$ to $R^9$ may each be independently an alkyl group or an aryl group, and $R^9$ may be an aryl group.

In the average compositional formula of Formula 5, e, f, g and h are each a molar ratio of siloxane units of the polyorganosiloxane (A). For example, e may be a positive number, f and g may each be independently 0 or a positive number, and h may be 0 or a positive number. When a sum of the molar ratios (e+f+g+h) is adjusted to be 1, e may be 0.01 to 0.3, f may be 0 to 0.97, or 0.65 to 0.97, g may be 0 to 0.97, or 0.65 to 0.97, and h may be 0 to 0.30, or 0.01 to 0.30. Here, (f+g)/(f+g+h) may be 0.7 to 1.

When the polyorganosiloxane (A) has a partially-crosslinked structure, (f+g)/(f+g+h) may be approximately 0.7 to 0.97, or 0.65 to 0.97. As a ratio of the siloxane units is controlled as described above, suitable physical properties according to an application can be ensured. For example, in the average compositional formula of Formula 5, all of f and g may not be 0. When all of f and g are not 0, f/g may be in the range from 0.3 to 2.0, 0.3 to 1.5, or 0.5 to 1.5.

A polymerized product including the polyorganosiloxane (A) may be, for example, a ring-opening polymerized product of a mixture a cyclic polyorganosiloxane. When the polyorganosiloxane (A) has a partially-crosslinked structure, the mixture may further include, for example, a polyorganosiloxane having a cage or partial cage structure, or including a T unit. As the cyclic polyorganosiloxane compound, for example, a compound represented by Formula 6 may be used.

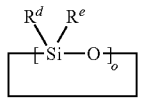
[Formula 6]

In Formula 6, $R^d$ and $R^e$ are each independently an epoxy group, or a monovalent hydrocarbon group, and o is 3 to 6.

The cyclic polyorganosiloxane may also include a compound of Formula 7 and a compound of Formula 8.

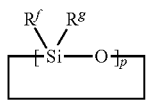
[Formula 7]

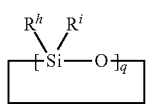
[Formula 8]

In Formulas 7 and 8, $R^f$ and $R^g$ are each an epoxy group or an alkyl group, $R^h$ and $R^i$ are each an epoxy group or an aryl group, p is a number of 3 to 6, and q is a number of 3 to 6. In Formulas 7 and 8, $R^f$ and $R^g$ are each independently an alkyl group, and $R^h$ and $R^i$ may each be independently an aryl group.

In Formulas 6 to 8, specific kinds of $R^f$ to $R^i$, or specific values of o, p and q, and a ratio of components in the mixture, may be determined by a desired structure of the polyorganosiloxane (A).

When the polyorganosiloxane (A) has a partially-crosslinked structure, the mixture may further include, for example, a compound having an average compositional formula of Formula 9, or a compound having an average compositional formula of Formula 10.

$[R^j SiO_{3/2}]$  [Formula 9]

$[R^k R^1_2 SiO_{1/2}]_p [R^m SiO_{3/2}]_q$  [Formula 10]

In Formulas 9 and 10, $R^j$, $R^k$ and $R^m$ are each independently an epoxy group or a monovalent hydrocarbon group, $R^1$ is an epoxy group or an alkyl group having 1 to 4 carbon atoms, p is 1 to 3, and q is 1 to 10.

In Formulas 9 to 10, specific kinds of $R^j$ to $R^m$ or specific values of p and q, and a ratio of components in the mixture, may be determined by a desired structure of the polyorganosiloxane (A).

When the cyclic polyorganosiloxane reacts with a polyorganosiloxane having a cage or partial cage structure, or including a T unit, a polyorganosiloxane having a desired partial crosslinking structure may be synthesized at a suitable molecular weight. In addition, according to the method, by minimizing a functional group such as an alkoxy group or a hydroxyl group binding to a silicon atom in the polyorganosiloxane or a polymerized product including the same, a desired product having excellent physical properties can be manufactured.

In one embodiment, the mixture may further include a compound represented by Formula 11.

$(R^n R^o_2 Si)_2 O$  [Formula 11]

In Formula 11, $R^n$ and $R^o$ are each an epoxy group or a monovalent hydrocarbon group.

In Formula 11, a specific kind of the monovalent hydrocarbon group or a blending ratio in the mixture may be determined by the desired polyorganosiloxane (A).

A reaction of each component in the mixture may be performed in the presence of a suitable catalyst. Accordingly, the mixture may further include a catalyst.

As the catalyst that can be included in the mixture, for example, a base catalyst may be used. A suitable base catalyst may be, but is not limited to, a metal hydroxide such as KOH, NaOH or CsOH; a metal silanolate including an alkali metal compound and a siloxane; or a quaternary ammonium compound such as tetramethylammonium hydroxide, tetraethylammonium hydroxide or tetrapropylammonium hydroxide.

A ratio of the catalyst in the mixture may be suitably selected in consideration of desired reactivity and, for example, may be 0.01 parts by weight to 30 parts by weight, or 0.03 parts by weight to 5 parts by weight with respect to 100 parts by weight of a total weight of the reaction products in the mixture. In the specification, unless particularly defined otherwise, the units "parts by weight" refer to a weight ratio between components.

In one embodiment, the reaction may be performed under a solvent-free condition in which a solvent is not used, or in the presence of a suitable solvent. As a solvent, any kind of solvent in which the reaction product in the mixture, that is, a disiloxane or polysiloxane, may be suitably mixed with a catalyst and does not interfere with reactivity may be used. The solvent may be, but is not limited to, an aliphatic hydrocarbon-based solvent such as n-pentane, i-pentane, n-hexane, i-hexane, 2,2,4-trimethyl pentane, cyclohexane or methylcyclohexane; an aromatic solvent such as benzene, toluene, xylene, trimethyl benzene, ethyl benzene or methylethyl benzene; a ketone-based solvent such as methylethylketone, methylisobutylketone, diethylketone, methyl n-propyl ketone, methyl n-butyl ketone, cyclohexanone, methylcyclohexanone or acetylacetone; an ether-based solvent such as tetrahydrofuran, 2-methyl tetrahydrofuran, ethyl ether, n-propyl ether, isopropyl ether, diglyme, dioxine, dimethyldioxine, ethyleneglycol monomethyl ether, ethyleneglycol dimethyl ether, ethyleneglycol diethyl ether, propyleneglycol monomethyl ether or propyleneglycol dimethyl ether; an ester-based solvent such as diethyl carbonate, methyl acetate, ethyl acetate, ethyl lactate, ethyleneglycol monomethylether acetate, propyleneglycol monomethylether acetate or ethyleneglycol diacetate; or an amide-based solvent such as N-methyl pyrrolidone, formamide, N-methyl formamide, N-ethyl formamide, N,N-dimethyl acetamide or N,N-diethylacetamide.

The reaction may be performed by adding the catalyst to the reaction product. Here, a reaction temperature may be controlled within a range of, for example, 0 to 150° C., or 30 to 130° C. In addition, a reaction time may be controlled within a range of, for example, 1 hour to 3 days.

The polyorganosiloxane (A) or a polymerized product including the same may have a ratio of an area of peak derived from an alkoxy group binding to a silicon atom with respect to an area of a peak derived from a functional group containing an aliphatic unsaturated bond binding to silicon, for example, an alkenyl group such as a vinyl group in a spectrum obtained by $^1$H NMR, of 0.01 or less, 0.005 or less, or 0. In the above range, suitable viscosity may be exhibited, and other physical properties may be excellently maintained.

The polyorganosiloxane (A) or a polymerized product including the same may have an acid value obtained by KOH titration of 0.02 or less, 0.01 or less, or 0. In the above range, suitable viscosity may be exhibited, and other physical properties may be excellently maintained.

The polyorganosiloxane (A) or a polymerized product including the same may have a viscosity at 25° C. of 500, 1000 cP or more, 2000 cP or more, or 5000 cP or more. In the above range, processibility and hardness can be suitably maintained. The upper limit of the viscosity is not particularly limited, and the viscosity may be, for example, 500000 cP or less, 400000 cP or less, 300000 cP or less, 200000 cP or less, 100000 cP or less, 80000 cP or less, 70000 cP or less or 65000 cP or less.

The polyorganosiloxane (A) or a polymerized product including the same may have a weight average molecular weight of 500 to 50000, or 1500 to 30000. The term "weight average molecular weight" may refer to a conversion value with respect to standard polystyrene measured by gel permeation chromatography (GPC). Unless particularly defined otherwise, the term "molecular weight" used herein may refer to a weight average molecular weight. In such a range of the molecular weight, moldability, hardness and strength can be suitably maintained.

The curable composition may further include a crosslinkable polyorganosiloxane (hereinafter, referred to as "polyorganosiloxane (B)". The term "crosslinkable polyorganosiloxane" may refer to a polyorganosiloxane essentially including a T or Q unit as a siloxane unit, and having a ratio (D/(D+T+Q)) of a D unit with respect to D, T and Q units of less than 0.65.

A crosslinkable polyorganosiloxane may have an average compositional formula of Formula 12.

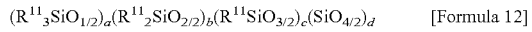

[Formula 12]

In Formula 12, $R^{11}$ are each independently an epoxy group or a monovalent hydrocarbon group, at least one of $R^{11}$ is an alkenyl group, at least one of $R^{11}$ is an aryl group, a is a positive number, b is 0 or a positive number, c is a positive number, d is 0 or a positive number, b/(b+c+d) is less than 0.65, 0.5 or less, or 0.3 or less, and c/(c+d) is 0.8, 0.85, 0.9 or more.

In Formula 12, at least one or two of $R^{11}$ may be an alkenyl group. In one embodiment, the alkenyl group may be present in such an amount that a molar ratio (Ak/Si) of the alkenyl group (Ak) with respect to all silicon atoms (Si) included in the polyorganosiloxane (B) is approximately 0.05 to 0.4, or 0.05 to 0.35. As the molar ratio (Ak/Si) is controlled to 0.05 or more, reactivity can be excellently maintained and leakage of an unreacted component from a surface of the cured product can be prevented. In addition, when the molar ratio (Ak/Si) is controlled to 0.4, or 0.35 or less, hardness, crack resistance, and thermal and shock resistance of the cured product can be excellently maintained.

In Formula 12, at least one of $R^{11}$ may be an aryl group. Accordingly, the refractive index and hardness of the cured product can be effectively controlled. The aryl group may be present in such an amount that a molar ratio (Ar/Si) of the aryl group (Ar) with respect to all silicon atoms (Si) included in the polyorganosiloxane (B) is approximately 0.5 to 1.5, or 0.5 to 1.2. As the molar ratio (Ar/Si) is controlled to 0.5 or more, the refractive index and hardness of the cured product can be maximized. In addition, as the molar ratio (Ar/Si) is controlled to 1.5 or less, or 1.2 or less, the viscosity and thermal and shock resistance of the composition can be suitably maintained.

In the average compositional formula of Formula 12, a, b, c and d are molar ratios of respective siloxane units. For example, when the sum (a+b+c+d) thereof is adjusted to be 1, a is 0.05 to 0.5, b is 0 to 0.3, c is 0.6 to 0.95 and d is 0 to 0.2. To maximize the strength, crack resistance and thermal and shock resistance of the cured product, (a+b)/(a+b+c+d) may be controlled to 0.2 to 0.7, b/(b+c+d) may be controlled to less than 0.65, or 0.5 or less, or 0.3 or less, c/(c+d) may be controlled to 0.8 or more, 0.85 or more, 0.9 or more. Here, the lower limit of b/(b+c+d) is not particularly limited and, for example, may be more than 0. In addition, here, the upper limit of c/(c+d) is not particularly limited and, for example, may be 1.0.

The polyorganosiloxane (B) may have a viscosity at 25° C. of 5000 cP or more, or 1000000 cP or more, and therefore processibility before curing, and hardness after curing can be suitably maintained.

The polyorganosiloxane (B) may have, for example, a molecular weight of 800 to 20000, or 800 to 10000. As the molecular weight is controlled to 800 or more, moldability before curing and strength after curing can be excellently maintained, and as the molecular weight is controlled to 20000 or less, or 10000 or less, the viscosity can be maintained at a suitable level.

A method of preparing the polyorganosiloxane (B) may be, for example, a method of preparing a polysiloxane conventionally known in the art, or a method similar to that of preparing the polyorganosiloxane (A).

The polyorganosiloxane (B) may be included, for example, in an amount such that a weight ratio (A/(A+B)) of the polyorganosiloxane (A) to a mixture of the polyorganosiloxane (A) and the polyorganosiloxane (B) is approximately 10 to 50. In the above range, the strength and thermal and shock resistance of the cured product can be excellently maintained, and surface stickiness can also be prevented.

The curable composition may further include a silicon compound including a hydrogen atom binding to a silicon atom (hereinafter, referred to as "silicon compound (C)"). The silicon compound (C) may have at least one or two hydrogen atoms.

The silicon compound (C) may serve as a crosslinking agent to crosslink a composition by a reaction with a functional group containing an aliphatic unsaturated bond of a polyorganosiloxane. For example, crosslinking and curing may be performed by addition-reacting a hydrogen atom of the silicon compound (C) and an alkenyl group of the polyorganosiloxane (A) and/or (B).

As the silicon compound (C), any one of various kinds of silicon compounds including a hydrogen atom binding to a silicon atom (Si—H) in a molecule may be used. The silicon compound (C) may be, for example, a linear, branched, cyclic, or crosslinkable organicpolysiloxane. The silicon compound (C) may be a compound having 2 silicon atoms to 1,000 silicon atoms, and preferably 3 silicon atoms to 300 silicon atoms.

The silicon compound (C) may be, for example, a compound of Formula 13, or a compound having an average compositional formula of Formula 14.

$R^{12}{}_3SiO(R^{12}{}_2SiO)_nSiR^{12}{}_3$ [Formula 13]

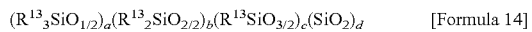

$(R^{13}{}_3SiO_{1/2})_a(R^{13}{}_2SiO_{2/2})_b(R^{13}SiO_{3/2})_c(SiO_2)_d$ [Formula 14]

In Formulas 13 and 14, $R^{12}$ are each independently hydrogen or a monovalent hydrocarbon group, at least two of $R^{12}$ are hydrogen atoms, at least one of $R^{12}$ is an aryl group, and n is 1 to 100. In addition, $R^{13}$ are each independently hydrogen or a monovalent hydrocarbon group, at least two of $R^{13}$ are hydrogen atoms, at least one of $R^{13}$ is an aryl group, a is a positive number, b is 0 or a positive number, c is a positive number, and d is 0 or a positive number. For example, when the sum (a+b+c+d) thereof is adjusted to be 1, a is 0.1 to 0.8, b is 0 to 0.5, c is 0.1 to 0.8, and d is 0 to 0.2.

The compound of Formula 13 is a linear siloxane compound having at least two hydrogen atoms binding to a silicon atom. In Formula 13, n may be 1 to 100, 1 to 50, 1 to 25, 1 to 10, or 1 to 5.

The compound represented as the average compositional formula of Formula 14 may be a polysiloxane having a crosslinked or partially-crosslinked structure.

In one embodiment, a molar ratio (H/Si) of a hydrogen atom (H) binding to a silicon atom with respect to all silicon atoms (Si) included in the silicon compound (C) may be 0.2 to 0.8 or 0.3 to 0.75. As the molar ratio is controlled to 0.2 or 0.3 or more, curability of the composition can be excellently maintained, and as the molar ratio is controlled to 0.8 or less, or 0.75 or less, crack resistance and thermal and shock resistance can be excellently maintained.

The silicon compound (C) may include at least one aryl group, and thus at least one of $R^{12}$ in Formula 13 or at least one $R^{13}$ in Formula 14 may be an aryl group. Accordingly, the refractive index and hardness of the cured product can be effectively controlled. The aryl group may be present in such an amount that a molar ratio (Ar/Si) of the aryl group (Ar) with respect to all silicon atoms (Si) included in the polyorganosiloxane (C) is approximately 0.5 to 1.5, or 0.5 to 1.3. As the molar ratio (Ar/Si) is controlled to 0.5 or more, the refractive index and hardness of the cured product can be maximized, and as the molar ratio (Ar/Si) is controlled to 1.5 or less, or 1.3 or less, the viscosity and crack resistance of the composition can be suitably maintained.

The compound (C) may have a viscosity at 25° C. of 0.1 cP to 100000 cP, 0.1 cP to 10000 cP, 0.1 cP to 1000 cP, or 0.1 cP to 300 cP. In the above range of viscosity, processibility of the composition and hardness of the cured product can be excellently maintained.

In addition, the compound (C) may have, for example, a molecular weight of less than 2,000, less than 1,000, or less than 800. When the molecular weight is 1,000 or more, the strength of the cured product may be degraded. The lower limit of the molecular weight of the compound (C) is not particularly limited, and may be, for example, 250. In the compound (C), the molecular weight may be a weight average molecular weight, or a conventional molecular weight of the compound.

A method of preparing the compound (C) is not particularly limited, and may employ a conventional method of preparing a polyorganosiloxane known in the art, or a similar method to that of preparing the polyorganosiloxane (A).

A content of the compound (C) may be selected within the range of a molar ratio (H/Ak) of a hydrogen atom (H) binding to a silicon atom included in the compound (C) with respect to all aliphatic unsaturated bond-containing functional groups included in the curable composition, for example, all functional groups (Ak) containing an aliphatic unsaturated bond such as an alkenyl group included in the polyorganosiloxane (A) and/or (B) of approximately 0.5 to 2.0, or 0.7 to 1.5. Within the above range of the molar ratio (H/Ak), a composition which exhibits excellent processibility and workability before curing, excellent crack resistance, hardness, thermal and shock resistance and adhesiveness, after curing, and does not cause whitening even under harsh conditions, or surface stickiness can be provided.

The curable composition may further include an organopolysiloxnae including functional groups having an aliphatic unsaturated bond, for example, an alkenyl group and an epoxy group (hereinafter, referred to as "polyorganosiloxane (D)").

The polyorganosiloxane (D) may serve as, for example, a tackifier to enhance adhesive strength.

In one embodiment, the polyorganosiloxane (D) may be represented as an average compositional formula of Formula 15.

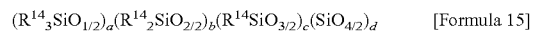

$(R^{14}{}_3SiO_{1/2})_a(R^{14}{}_2SiO_{2/2})_b(R^{14}SiO_{3/2})_c(SiO_{4/2})_d$ [Formula 15]

In Formula 15, $R^{14}$ are each independently an epoxy group or a monovalent hydrocarbon group, at least one of $R^{14}$ is an alkenyl group, at least one of $R^{14}$ is an epoxy group, a, b, c and d are each independently 0 or a positive number, (c+d)/(a+b+c+d) may be 0.2 to 0.7, and c/(c+d) may be 0.8 or more. For example, when the sum of the molar ratios (a+b+c+d) is adjusted to be 1, a may be 0 to 0.7, b may be 0 to 0.5, c may be 0 to 0.8, and d may be 0 to 0.2.

In Formula 15, at least one of $R^{14}$ may be an alkenyl group. In one embodiment, the alkenyl group may be present in such an amount that a molar ratio (Ak/Si) of the alkenyl group (Ak) with respect to all silicon atoms (Si) included in the polyorganosiloxane (D) is 0.05 to 0.35, or 0.05 to 0.3. In such a molar ratio (Ak/Si), a cured product which exhibits excellent reactivity to another compound and has excellent adhesive strength and excellent physical properties such as shock resistance can be provided.

In Formula 15, at least one of $R^{14}$ may also be an epoxy group. Accordingly, the strength and scratch resistance of the cured product can be suitably maintained and excellent adhesiveness can be achieved. The epoxy group may be present in such an amount that a molar ratio (Ep/Si) of the epoxy group (Ep) with respect to all silicon atoms (Si) included in the polyorganosiloxane (D) may be 0.1 or more, or 0.2 or more. In such a molar ratio (Ep/Si), a crosslinking structure of the cured product can be suitably maintained, and thermal resistance and adhesiveness can also be excellently maintained. The upper limit of the molar ratio (Ep/Si) is not particularly limited, and may be, for example, 1.0.

In the average compositional formula of Formula 15, a, b, c and d are molar ratios of respective siloxane units, and when the sum thereof is adjusted to be 1, a may be 0 to 0.7, b may be 0 to 0.5, c may be 0 to 0.8, d may be 0 to 0.2. Here, c and d may not be simultaneously 0. To maximize strength, crack resistance and thermal and shock resistance of the cured product, (a+b)/(a+b+c+d) may be controlled to 0.3 to 0.7, and c/(c+d) may be controlled to 0.8 or more. Here, the upper limit of c/(c+d) is not particularly limited and, for example, may be 1.0.

The polyorganosiloxane (D) may have a viscosity at 25° C. of 100 cP or more, or 100,000 cP or more, and therefore processability before curing and hardness after curing can be suitably maintained.

The polyorganosiloxane (D) may have, for example, a molecular weight of 1,000 or 1,500 or more. As the molecular weight is controlled to 1,000 or more, or 1,500 or more, a cured product having excellent processability and workability before curing, and excellent crack resistance, thermal and shock resistance and adhesiveness to a substrate after curing can be provided. The upper limit of the molecular weight is not particularly limited, and may be, for example, 20,000.

A method of preparing the polyorganosiloxane (D) is not particularly limited, and may employ, for example, a conventional method of preparing a polyorganosiloxane known in the art, or a method similar to that of preparing the polyorganosiloxane (A).

The polyorganosiloxane (D) may be included in an amount of, for example, 0.2 parts by weight to 10 parts by weight, or 0.5 parts by weight to 5 parts by weight with respect to 100 parts by weight of a total weight of another compound in the curable composition, for example, the polyorganosiloxane (A), the polyorganosiloxane (B), and/or the silicon compound (C). In the above range, adhesiveness and transparency can be excellently maintained.

The curable composition may include a fiber-type filler, for example, a fiber-type inorganic filler. The term "fiber-type filler" used herein may refer to a filter having a relatively higher horizontal length (particle size, inner diameter, or outer diameter) with respect to a vertical length (length of the filler) based on a single strand, for example, a filler having an aspect ratio (vertical length/horizontal length) of 5 or more, 10 or more, 20 or more, 30 or more, 40 or more, 50 or more, or 100 or more. In the fiber-type filler, the aspect ratio (vertical length/horizontal length) may be, for example, 2,000 or less, 1,600 or less, 1,500 or less, 1,200 or less, 1,000 or less, 700 or less, 500 or less, or 400 or less.

The fiber-type filler may be a hollow fiber-type filler. The term "hollow fiber-type filler" may refer to a filler having a hole inside, for example, a filler in the form of a pipe. When an aspect ratio of the hollow fiber-type filler is calculated, the horizontal length may be, for example, an inner or outer diameter of the fiber.

The fiber-type filler, particularly, a hollow fiber-type filler has a lower crystallinity, less interactivity between particles, and higher dispersity than other types of fillers, for example, a planar, spherical or another shape of filler. Accordingly, such a filler may inhibit an increase in viscosity of the composition, and may be less agglomerated. In addition, since the fiber-type filler has an anisotropic structure, it is preferable for enhancing mechanical characteristic and crack resistance, and has excellent thixotropy, thereby effectively inhibiting precipitation of a fluorescent material with a small amount.

The particle size of a single strand of the fiber-type filler, or the inner or outer diameter of the single strand of the hollow fiber-type filler is not particularly limited, but may be, for example, approximately 0.5 nm to 1,000 nm, 0.5 nm to 800 nm, 0.5 nm to 600 nm, 0.5 nm to 500 nm, 0.5 nm to 300 nm, 0.5 nm to 200 nm, 1 nm to 150 nm, 1 nm to 100 nm, 1 nm to 80 nm, 1 nm to 60 nm, or 1 nm to 50 nm.

The fiber-type filler may have a refractive index of, for example, approximately 1.45 or more. In addition, the fiber-type filler may satisfy Equation 1.

$$|X-Y| \leq 0.1 \qquad \text{[Equation 1]}$$

In Equation 1, X is a refractive index of the curable composition or a cured product thereof except the filler, and Y is a refractive index of the filler.

The term "refractive index" used herein may be, for example, a refractive index measured with respect to light having a wavelength of 450 nm. In the above range, as transparency of the composition or the cured product is maintained to be applied to an element, a brightness thereof can be enhanced. In Equation 1, |X—Y| may be, for example, 0.07 or less, or 0.05 or less.

As the fiber-type filler, imogolite or halloysite may be used. Imogolite is a hollow fiber-type compound derived from aluminum silicate and represented as $Al_2SiO_3(OH)_4$, and halloysite is also a hollow fiber-type compound derived from aluminum silicate and represented as $Al_2Si_2O_5(OH)_4$.

The filler may be included in an amount of 0.5 parts by weight to 70 parts by weight, 1 parts by weight to 50 parts by weight, 5 parts by weight to 50 parts by weight, 10 parts by weight to 50 parts by weight, or 10 parts by weight to 40 parts by weight in the curable composition, for example, with respect to 100 parts by weight of the polyorganosiloxane (A). As the weight ratio of the fiber-type filler is controlled to 0.5 parts by weight or more, a mechanical characteristic, crack resistance and thermal resistance of the composition or cured product can be enhanced, thereby improving reliability of the element. In addition, as the weight ratio is controlled to 70 parts by weight or less, processability can be excellently maintained.

The curable composition may further include a hydrosilylation catalyst. The hydrosilylation catalyst may be used to stimulate a hydrosilylation reaction. As a hydrosilylation catalyst, any conventional component known in the art may be used. As such a catalyst, a platinum-, palladium- or rhodium-based catalyst may be used. In the specification, a platinum-based catalyst may be used in consideration of catalyst efficiency, and may be, but is not limited to, chloroplatinic acid, platinum tetrachloride, an olefin complex of platinum, an alkenyl siloxane complex of platinum, or a carbonyl complex of platinum.

A content of the hydrosilylation catalyst is not particularly limited as long as the hydrosilylation catalyst is included at a catalytic amount, that is, an amount capable of serving as a catalyst. Conventionally, the hydrosilylation catalyst may be used at 0.1 ppm to 100 ppm, and preferably 0.2 ppm to 100 ppm based on an atomic weight of platinum, palladium or rhodium.

The curable composition may further include a tackifier, alone or in combination with the polyorganosiloxane (D), in order to further enhance adhesiveness to various substrates. The tackifier is a component capable of improving self-adhesiveness to the composition or cured product, and may improve self-adhesiveness particularly to a metal and an organic resin.

The tackifier may be, but is not limited to, a silane having at least one or two functional groups selected from the group consisting of an alkenyl group such as a vinyl group, a (meth) acryloyloxy group, a hydrosilyl group (SiH group), an epoxy group, an alkoxy group, an alkoxysilyl group, a carbonyl group and a phenyl group; or an organic silicon compound such as a cyclic or linear siloxane having 2 to 30 or 4 to 20 silicon atoms. In the specification, at least one of the tackifiers may be additionally mixed.

The tackifier may be included in the composition in a content of 0.1 parts by weight to 20 parts by weight with respect to 100 parts by weight of a total weight of another compound in the curable composition, for example, the polyorganosiloxane (A), the polyorganosiloxane (B), and/or the silicon compound (C), but the content may be suitably changed in consideration of desired improvement in adhesiveness.

The curable composition may further include at least one of additives including a reaction inhibitor such as 2-methyl-3-butyne-2-ol, 2-phenyl-3-1-butyne-2-ol, 3-methyl-3-pentene-1-yne, 3,5-dimethyl-3-hexene-1-yne, 1,3,5,7-tetramethyl-1,3,5,7-tetrahexenylcyclotetrasiloxane or ethynylcyclohexane; an inorganic filler such as silica, alumina, zirconia or titania; a carbon-functional silane having an epoxy group and/or an alkoxysilyl group, a partial hydrolysis-condensation product thereof or a siloxane compound; a thixotropic agent such as a haze-phase silica that can be used in combination with polyether; a conductivity providing agent such as metal powder of silver, copper or aluminum or various carbon materials; or a color adjusting agent such as a pigment or dye, as needed.

The curable composition may further include a fluorescent material. In this case, a kind of a fluorescent material which can be used is not particularly limited and, for example, a conventional kind of a fluorescent material applied to an LED package may be used to realize white light.

Another aspect of the present application provides a semiconductor element, for example, a photonic semiconductor element. The illustrative semiconductor element may be encapsulated by an encapsulant including a cured product of the curable composition. Examples of a semiconductor element encapsulated by an encapsulant include a diode, a transistor, a thyristor, a photocoupler, a CCD, a solid-phase image pick-up diode, a monolithic IC, a hybrid IC, an LSI, a VLSI or a light-emitting diode (LED). In one embodiment, the semiconductor element may be an LED.

The LED may be formed by stacking a semiconductor material on a substrate. The semiconductor material may be, but is not limited to, GaAs, GaP, GaAlAs, GaAsP, AlGaInP, GaN, InN, AlN, InGaAlN or SiC. In addition, as the substrate, sapphire, spinel, SiC, Si, ZnO or GaN monocrystal may be used.

In addition, to prepare the LED, when necessary, a buffer layer may be formed between a substrate and a semiconductor material. As the buffer layer, GaN or AlN may be used. A method of stacking a semiconductor material on a substrate may be, but is not particularly limited to, MOCVD, HDVPE or liquid growth. In addition, a structure of the LED may be, for example, a monojunction including an MIS junction, a PN junction, and a PIN junction, a heterojunction, or a double heterojunction. In addition, the LED may be formed using a mono or multiple quantum well structure.

In one embodiment, an emission wavelength of the LED may be, for example, 250 nm to 550 nm, 300 nm to 500 nm, or 330 nm to 470 nm. The emission wavelength may refer to a main emission peak wavelength. As the emission wavelength of the LED is set in the above range, a white LED having a longer life span, high energy efficiency and high color expression can be obtained.

The LED may be encapsulated using the composition. In addition, the encapsulation of the LED may be performed only using the composition, and in some cases, another encapsulant may be used in combination with the composition. When two kinds of encapsulant are used in combination, after the encapsulation using the composition, the encapsulated LED may also be encapsulated with another encapsulant. Alternatively, the LED may be first encapsulated with the other encapsulant and then encapsulated again with the composition. As the other encapsulant, an epoxy resin, a silicon resin, an acryl resin, a urea resin, an imide resin, or glass may be used.

To encapsulate the LED with the composition, for example, a method including injecting the composition into a mold beforehand, dipping a lead frame to which the LED is fixed therein and curing the composition. Alternatively, a method including injecting the composition into a mold into which the LED is inserted and curing the composition may be used. As a method of injecting the composition, injection by a dispenser, transfer molding, or injection molding may be used. In addition, as other encapsulating methods, a method of dropping the composition on the LED, coating the composition by screen printing or using a mask and curing the composition, and a method of injecting the composition into a cup in which the LED is disposed on its bottom by a dispenser and curing the composition may be included.

In addition, the composition may be used as a diamond material fixing the LED to a lead terminal or package, or a passivation layer or package substrate on the LED as needed.

When it is necessary to cure the composition, the curing is not particularly limited, and may be performed, for example, by maintaining the composition at a temperature of 60° C. to 200° C. for 10 minutes to 5 hours, or in 2 or more steps at suitable temperatures and for suitable amounts of time.

A shape of the encapsulant is not particularly limited and, for example, may be a bullet-shaped lens, planar shape, or thin film shape.

In addition, further enhancement of performance of the LED may be promoted according to conventional methods known in the art. To enhance performance, for example, a method of disposing a reflective layer or light collecting layer on a back surface of the LED, a method of forming a complementary coloring part on its bottom, a method of disposing a layer absorbing light having a shorter wavelength than the main emission peak on the LED, a method of encapsulating the LED and further molding the LED with a lightweight material, a method of inserting the LED into a through hole to be fixed, or a method of contacting the LED with a lead member by flip-chip contact to extract light from a direction of the substrate, may be used.

The LED may be effectively applied to, for example, backlights for liquid crystal displays (LCDs), lights, various kinds of sensors, light sources of a printer and a copy machine, light sources for an automobile gauge, signal lights, pilot lights, display devices, light sources of planar-type LEDs, displays, decorations, or various kinds of lightings.

Effect

A curable composition according to the present application exhibits excellent processibility and workability. In addition, the curable composition exhibits excellent light extraction efficiency, hardness, thermal and shock resistance, moisture resistance, gas permeability and adhesiveness, after curing. In addition, the curable composition can provide a cured product that exhibits long-lasting durability and reliability even under harsh conditions, and that does not cause whitening and surface stickiness.

Illustrative Embodiments

Hereinafter, a curable composition according to the present application will be described in further detail with reference to Examples and Comparative Examples, but the range of the curable composition is not limited to the following Examples. Hereinafter, the abbreviation "Vi" refers to a vinyl group, the abbreviation "Ph" refers to a phenyl group, the abbreviation "Me" refers to a methyl group, and the abbreviation "Ep" refers to a 3-glycidoxypropyl group.

1. Measurement of Light Transmittance

Light transmittance of curable materials of Examples and Comparative Examples were evaluated by the following method. A curable composition was injected between two glass substrates spaced approximately 1 mm apart from each other and cured at 150° C. for 1 hour, thereby preparing a planar sample having a thickness of 1 mm. Subsequently, light transmittance of the sample in a thickness direction with respect to a wavelength of 450 nm was measured using a UV-VIS spectrometer at room temperature and then evaluated according to the following criteria.

<Criteria for evaluating light transmittance>

○: light transmittance of 85% or more

Δ: light transmittance of 75% or more, and less than 85%

X: light transmittance of less than 75%

2. Evaluation of Characteristics of Element

Characteristics of an element were evaluated using a 7030 LED package manufactured of polyphthalamide (PPA). Specifically, a curable composition was dispensed in a PPA cup, maintained at 70° C. for 30 minutes, and then cured at 150° C. for 1 hour, thereby manufacturing a surface-mounting LED. Afterward, a test was performed according to the following method.

(1) Thermal Shock Test

The LED was maintained at −40° C. for 30 minutes, and maintained again at 85° C. for 30 minutes, which was set as one cycle. This process was repeated 200 times, that is, for 200 cycles, and then the LED was maintained at room temperature. A peeling state was investigated to evaluate thermal and shock resistance. For evaluation, 20 LEDs manufactured of the same curable composition were tested as described above, and a number of LEDs that exhibited peeling is shown in Table 1 (number of peeled LEDs/total number of LEDs (20)).

(2) Long-Lasting Reliability Test

The manufactured LED was operated for 500 hours while 30 mA of current was supplied under conditions of 85° C. and a relative humidity of 85%. Subsequently, a reduction rate of the brightness after operation compared to initial brightness before operation was measured and evaluated according to the following criteria.

<Evaluation Criteria>

A: brightness reduction rate of 5% or less with respect to initial brightness

B: brightness reduction rate of more than 5% and also 7% or less with respect to initial brightness C: brightness reduction rate of more than 7% and also 9% or less with respect to initial brightness D: brightness reduction rate of more than 9% with respect to initial brightness

EXAMPLE 1

A curable composition capable of being cured by hydrosilylation was prepared by mixing compounds represented by Formulas A to D (blending amount: Formula A: 70 g, Formula B: 200 g, Formula C: 70 g, and Formula D: 4 g). Here, the polyorganosiloxane of Formula A was prepared by reacting a mixture of octamethylcyclotetrasiloxane and octaphenylcyclotetrasiloxane with divinyltetramethyldisiloxane in the presence of a catalyst such as tetramethylammonium hydroxide (TMAH) at approximately 115° C. for approximately 20 hours, and the compounds other than the polyorganosiloxane of Formula A were prepared by known synthesis methods. Subsequently, a catalyst (platinum(0)-1,3-divinyl-1,1,3,3-tetramethyldisiloxane) was blended into the composition in a content of Pt (0) of 10 ppm, and 20 g of hollow-type imogolite having an average outer diameter of approximately 2 mm and a length of approximately 400 nm was uniformly mixed, thereby preparing the curable composition.

$(ViMe_2SiO_{1/2})_2(Me_2SiO_{2/2})_{18}(Ph_2SiO_{2/2})_{14}$ [Formula A]

$(ViMe_2SiO_{1/2})_2(Ph_2SiO_{2/2})_{0.4}(PhSiO_{3/2})_6$ [Formula B]

$(HMe_2SiO_{1/2})_2(Ph_2SiO_{2/2})_{1.5}$ [Formula C]

$(ViMe_2SiO_{1/2})_2(EpSiO_{3/2})_3(MePhSiO_{2/2})_{20}$ [Formula D]

EXAMPLE 2

A curable composition capable of being cured by hydrosilylation was prepared by mixing compounds represented by Formulas E, F, C and D (blending amount: Formula E: 70 g, Formula F: 200 g, Formula C: 70 g, and Formula D: 4 g). Here, the polyorganosiloxane of Formula E was prepared by reacting a mixture of octamethylcyclotetrasiloxane and tetramethyltetraphenylcyclotetrasiloxane with divinyltetramethyldisiloxane in the presence of a catalyst such as tetramethylammonium hydroxide (TMAH), and the compounds other than the polyorganosiloxane of Formula A were prepared by known synthesis methods. Subsequently, a catalyst (platinum(0)-1,3-divinyl-1,1,3,3-tetramethyldisiloxane) was blended into the composition in a content of Pt(0) of 10 ppm, and approximately 20 g of hollow-type halloysite having an average inner diameter of approximately 50 mm and a length of approximately 8,000 nm was uniformly mixed, thereby preparing the curable composition.

$(ViMe_2SiO_{1/2})_2(PhMeSiO_{2/2})_{26}(Me_2SiO_{2/2})_4$ [Formula E]

$(ViMe_2SiO_{1/2})_2(MePhSiO_{2/2})_{0.4}(PhSiO_{3/2})_6$ [Formula F]

$(HMe_2SiO_{1/2})_2(Ph_2SiO_{2/2})_{1.5}$ [Formula C]

$(ViMe_2SiO_{1/2})_2(EpSiO_{3/2})_3(MePhSiO_{2/2})_{20}$ [Formula D]

EXAMPLE 3

A curable composition capable of being cured by hydrosilylation was prepared by mixing compounds represented by Formulas G, H, C and D (blending amount: Formula G 70 g, Formula H: 200 g, Formula C: 70 g, and Formula E: 4 g). Here, the polyorganosiloxane of Formula G was prepared by reacting a mixture of octamethylcyclotetrasiloxane, octaphenylcyclotetrasiloxane, octaphenyl-polyhedral oligomeric silsesquioxane (octaphenyl-POSS) and divinyltetramethyldisiloxane with a catalyst such as tetramethylammonium hydroxide (TMAH) at a suitable temperature, and the other compounds were prepared by known methods. Subsequently, a catalyst (platinum(0)-1,3-divinyl-1,1,3,3-tetramethyldisiloxane) was blended into the composition in a content of Pt(0) of 10 ppm, and approximately 20 g of hollow-type halloysite having an average inner diameter of approximately 30 mm and a length of approximately 10,000 nm was uniformly mixed, thereby preparing the curable composition.

$(ViMe_2SiO_{1/2})_2(Me_2SiO_{2/2})_{10}(Ph_2SiO_{2/2})_{10}(PhSiO_{3/2})_3$ [Formula G]

(ViMe$_2$SiO$_{1/2}$)$_2$(MePhSiO$_{2/2}$)$_{0.4}$(PhSiO$_{3/2}$)$_6$ [Formula H]

(HMe$_2$SiO$_{1/2}$)$_2$(Ph$_2$SiO$_{2/2}$)$_{1.5}$ [Formula C]

(ViMe$_2$SiO$_{1/2}$)$_2$(EpSiO$_{3/2}$)$_3$(MePhSiO$_{2/2}$)$_{20}$ [Formula D]

EXAMPLE 4

A curable composition capable of being cured by hydrosilylation was prepared by mixing compounds represented by Formulas I, J, C and D (blending amount: Formula I: 70 g, Formula J: 200 g, Formula C: 70 g, and Formula D: 4 g). Here, the polyorganosiloxane of Formula I was prepared by reacting a mixture of octamethylcyclotetrasiloxane and octaphenylcyclotetrasiloxane with divinyltetramethyldisiloxane in the presence of a catalyst such as tetramethylammonium hydroxide (TMAH), and compounds other than this were prepared by known synthesis methods. Subsequently, a catalyst (platinum(0)-1,3-divinyl-1,1,3,3-tetramethyldisiloxane) was blended into the composition in a content of Pt(0) of 10 ppm, and approximately 20 g of hollow-type halloysite having an average inner diameter of approximately 40 mm and a length of approximately 5,000 nm was uniformly mixed, thereby preparing the curable composition.

(ViMe$_2$SiO$_{1/2}$)$_2$(Me$_2$SiO$_{2/2}$)$_{14}$(Ph$_2$SiO$_{2/2}$)$_{16}$ [Formula I]

(ViMe$_2$SiO$_{1/2}$)$_2$(Ph$_2$SiO$_{2/2}$)$_{0.4}$(PhSiO$_{3/2}$)$_6$ [Formula J]

(HMe$_2$SiO$_{1/2}$)$_2$(Ph$_2$SiO$_{2/2}$)$_{1.5}$ [Formula C]

(ViMe$_2$SiO$_{1/2}$)$_2$(EpSiO$_{3/2}$)$_3$(MePhSiO$_{2/2}$)$_{20}$ [Formula D]

COMPARATIVE EXAMPLE 1

A curable composition was prepared by the same method as described in Example 1, except that imogolite was not blended.

COMPARATIVE EXAMPLE 2

A curable composition was prepared by the same method as described in Example 1, except that imogolite was not blended and silica particles having an average particle size of approximately 20 nm were used.

COMPARATIVE EXAMPLE 3

A curable composition was prepared by the same method as described in Example 1, except that imogolite was not blended and glass flakes (REP-015, Nippon Itarahas) were used.

COMPARATIVE EXAMPLE 4

A curable composition was prepared by the same method as described in Example 1, except that imogolite was not blended, and montmorillonite clay was used.

Physical properties of the curable compositions prepared in the Examples and Comparative Examples were measured and summarized in Table 1.

TABLE 1

| | Light transmittance | Thermal shock resistance | Long-lasting reliability |
|---|---|---|---|
| Example 1 | O | 0//20 | A |
| Example 2 | O | 0/20 | B |
| Example 3 | O | 0/20 | A |
| Example 4 | O | 0/20 | A |

TABLE 1-continued

| | Light transmittance | Thermal shock resistance | Long-lasting reliability |
|---|---|---|---|
| Comparative Example 1 | O | 16/20 | D |
| Comparative Example 2 | C | — | — |
| Comparative Example 3 | C | 4/20 | C |
| Comparative Example 4 | C | 6/20 | C |

In Comparative Example 2, since the viscosity of the composition was very high, it was impossible to manufacture an LED, and thus physical properties other than light transmittance, were impossible to measure.

A curable composition according to the present application exhibits excellent processibility and workability. In addition, the curable composition exhibits excellent light extraction efficiency, hardness, thermal and shock resistance, moisture resistance, gas permeability and adhesiveness, after curing. In addition, the curable composition can provide a cured product that exhibits long-lasting durability and reliability even under harsh conditions, and that does not cause whitening and surface stickiness.

What is claimed is:

1. A curable composition, comprising:
a polymerized product comprising a polyorganosiloxane which comprises a functional group having an aliphatic unsaturated bonda siloxane unit of Formulas 2 and a siloxane unit of 3, and in which a molar ratio of the siloxane unit of Formula 2 with respect to the entire bifunctional siloxane units is 30% or more; and
a filler in the shape of the fiber:

(R$^1$R$^2$SiO$_{2/2}$) [Formula 2]

(R$^3$$_2$SiO$_{2/2}$) [Formula 3]

wherein R$^1$ and R$^2$ are each independently an epoxy group or a monovalent hydrocarbon group and R$^3$'s are an aryl group, and
wherein the filler is in the shape of the hollow fiber.

2. The curable composition according to claim 1, wherein R$^1$ and R$^2$ are each independently an alkyl group.

3. The curable composition according to claim 1, wherein a molar ratio of the siloxane unit of Formula 3 with respect to the bifunctional siloxane units comprising an aryl group in the polyorganosiloxane is 70% or more.

4. The curable composition according to claim 1, wherein the polyorganosiloxane has an average compositional formula of Formula 4:

(R$^4$$_3$SiO$_{1/2}$)$_a$(R$^4$$_2$SiO$_{2/2}$)$_b$(R$^4$SiO$_{3/2}$)$_c$(SiO$_{4/2}$)$_d$ [Formula 4]

wherein R$^4$'s are each independently an epoxy group or a monovalent hydrocarbon group, with the proviso that at least one of R$^4$'s is an alkenyl group and at least one of R$^4$'s is an aryl group; and a and b are each independently a positive number, c and d are each independently 0 or a positive number, and b/(b+c+d) is 0.7 to 1.

5. The curable composition according to claim 1, wherein the polyorganosiloxane has an average compositional formula of Formula 5:

(R$^5$R$^6$$_2$SiO$_{1/2}$)$_e$(R$^7$R$^8$SiO$_{2/2}$)$_f$(R$^9$$_2$SiO$_{2/2}$)$_g$(R$^{10}$SiO$_{3/2}$)$_h$ [Formula 5]

wherein R$^5$ is a monovalent hydrocarbon group, R$^6$ is an alkyl group having 1 to 4 carbon atoms, R$^7$ and R$^8$ are each independently an alkyl group, an alkenyl group, an epoxy group or an aryl group, R$^9$ is an epoxy group or an aryl group, e is a positive number, f, g, and h are each independently 0 or a positive number, and (f+g)/(f+g+h) is 0.7 to 1.

6. The curable composition according to claim 1, wherein the polyorganosiloxane comprises a unit of Formula 1:

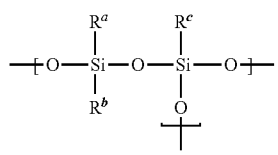

[Formula 1]

wherein $R^a$ and $R^b$ are each independently an alkyl group, an alkenyl group, or an aryl group, and $R^c$ is an alkyl group or an aryl group.

7. The curable composition according to claim 1, wherein the polymerized product is a polymerized product of a mixture comprising a compound of Formula 6:

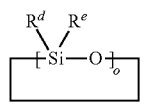

[Formula 6]

wherein $R^d$ and $R^e$ are each independently an epoxy group, or a monovalent hydrocarbon group, and o is 3 to 6.

8. The curable composition according to claim 1, wherein the polymerized product is a polymerized product of a mixture comprising a compound of Formula 6:

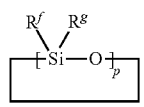

[Formula 7]

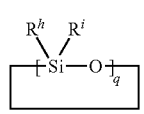

[Formula 8]

wherein $R^f$ and $R^g$ are each an epoxy group or an alkyl group, $R^h$ and $R^i$ are each an epoxy group or an aryl group, p is a number of 3 to 6, and q is a number of 3 to 6.

9. The curable composition according to any one of claims 7 and 8, wherein the mixture further comprises a polyorganosiloxane having an average compositional formula of Formula 9 or 10:

$[R^j SiO_{3/2}]$ [Formula 9]

$[R^k R^1{}_2 SiO_{1/2}]_p [R^m SiO_{3/2}]_q$ [Formula 10]

wherein $R^j$, $R^k$ and $R^m$ are each independently an epoxy group or a monovalent hydrocarbon group, $R^1$ is an alkyl group having 1 carbon atoms to 4 carbon atoms, p is 1 to 3, and q is 1 to 10.

10. The curable composition according to claim 1, wherein an aspect ratio of the filler in the shape of the fiber is 50 or more.

11. The curable composition according to claim 1, wherein an inner or outer diameter of a single strand of the filler in the shape of the hollow fiber is from 0.5 nm to 1,000 nm.

12. The curable composition according to claim 1, wherein a refractive index of the filler in the shape of the fiber is 1.45 or more.

13. The curable composition according to claim 1, wherein the filler in the shape of the hollow fiber is imogolite or halloysite.

14. The curable composition according to claim 1, wherein the filler in the shape of the fiber is comprised in an amount of 0.5 to 70 parts by weight relative to 100 parts by weight of the polyorganosiloxane.

15. The curable composition according to claim 1, further comprising: a polyorganosiloxane having an average compositional formula of Formula 12:

$(R^{11}{}_3 SiO_{1/2})_a (R^{11}{}_2 SiO_{2/2})_b (R^{11} SiO_{3/2})_c (SiO_{4/2})_d$ [Formula 12]

whereinin $R^{11}$'s are each independently an epoxy group, or a monovalent hydrocarbon group, with the proviso that at least one of $R^{11}$'s are an alkenyl group and at least one of $R^{11}$'s is an aryl group; and a is a positive number, b is 0 or a positive number, c is a positive number, and d is 0 or a positive number, b/(b+c+d) less than 0.65, and c/(c+d) is 0.8 or more.

16. The curable composition according to claim 1, further comprising a compound of Formula 13, or a compound having an average compositional formula of Formula 14:

$R^{12}{}_3 SiO(R^{12}{}_2 SiO)_n SiR^{12}{}_3$ [Formula 13]

$(R^{13}{}_3 SiO^{1/2})_a (R^{13}{}_2 SiO_{2/2})_b (R^{13} SiO_{3/2})_c (SiO_2)_d$ [Formula 14]

wherein $R^{12}$'s are each independently hydrogen, or a monovalent hydrocarbon group, with the proviso that at least two of $R^{12}$'s are hydrogen atoms, and at least one of $R^{12}$'s is an aryl group; and n is 1 to 100, $R^{13}$'s are each independently hydrogen, or a monovalent hydrocarbon group, with the proviso that at least two of $R^{13}$'s are hydrogen atoms and at least one of $R^{13}$'s are an aryl group; and a is a positive number, b is 0 or a positive number, c is a positive number, and d is 0 or a positive number.

17. A photonic semiconductor encapsulated by the cured composition of claim 1.

18. A liquid crystal display comprising the photonic semiconductor of claim 17 in a backlight unit.

19. A lighting apparatus comprising the photonic semiconductor of claim 17.

* * * * *